US012679043B2

(12) United States Patent　　　　(10) Patent No.: US 12,679,043 B2
Takahashi et al.　　　　　　　　　　(45) Date of Patent:　　　Jul. 14, 2026

(54) BONDING APPARATUS, BONDING METHOD AND ARTICLE MANUFACTURING METHOD

(71) Applicant: CANON KABUSHIKI KAISHA,
Tokyo (JP)

(72) Inventors: Kai Takahashi, Tochigi (JP);
Kenichiro Mori, Tochigi (JP)

(73) Assignee: CANON KABUSHIKI KAISHA,
Tokyo (JP)

( * ) Notice: Subject to any disclaimer, the term of this
patent is extended or adjusted under 35
U.S.C. 154(b) by 138 days.

(21) Appl. No.: 18/484,766

(22) Filed: Oct. 11, 2023

(65) Prior Publication Data

US 2024/0131805 A1　　Apr. 25, 2024
US 2024/0227316 A9　　Jul. 11, 2024

(30) Foreign Application Priority Data

Oct. 20, 2022　(JP) ................................. 2022-168564

(51) Int. Cl.
H10P 72/50　　　(2026.01)
B29C 65/78　　　(2006.01)
H10P 72/00　　　(2026.01)
H10P 72/70　　　(2026.01)

(52) U.S. Cl.
CPC ...... B29C 65/7802 (2013.01); B29C 65/7841
(2013.01); H10P 72/0606 (2026.01); **H10P
72/50 (2026.01); H10P 72/53 (2026.01); H10P
72/7434** (2026.01)

(58) Field of Classification Search
CPC ................... H01L 21/68; H01L 21/681; H01L
2221/68368; H10P 72/7434; H10P 72/53;
H10P 72/0606
See application file for complete search history.

(56) References Cited

U.S. PATENT DOCUMENTS

| | | | |
|---|---|---|---|
| 9,728,519 B2 | 8/2017 | Kurita | |
| 10,919,280 B2* | 2/2021 | Hemnani | ............... B82Y 10/00 |
| 2011/0058150 A1* | 3/2011 | Schaper | ................. G03B 27/42 |
| | | | 355/53 |
| 2016/0126218 A1* | 5/2016 | Kurita | .................... H01L 24/75 |
| | | | 156/349 |

FOREIGN PATENT DOCUMENTS

| | | |
|---|---|---|
| JP | 2004039802 A | 2/2004 |
| JP | 2016092078 A | 5/2016 |

OTHER PUBLICATIONS

Office Action issued in Taiwanese Appln. No. 112137851 dated Sep.
16, 2025.

* cited by examiner

*Primary Examiner* — Scott W Dodds

(74) *Attorney, Agent, or Firm* — ROSSI, KIMMS &
McDOWELL LLP

(57) ABSTRACT

A bonding apparatus for bonding a second object to a first
object, including a holding unit configured to hold a sheet
with the second object stuck thereto, a protrusion mecha-
nism configured to protrude the second object to a side of the
first object via the sheet held by the holding unit, a mea-
surement unit configured to measure, with respect to the first
object, a position of the second object stuck to the sheet held
by the holding unit, and a processing unit configured to
perform a process of positioning the first object and the
second object based on the position measured by the mea-
surement unit in a state in which the second object is
protruded to the side of the first object by the protrusion
mechanism.

13 Claims, 5 Drawing Sheets

F I G. 1
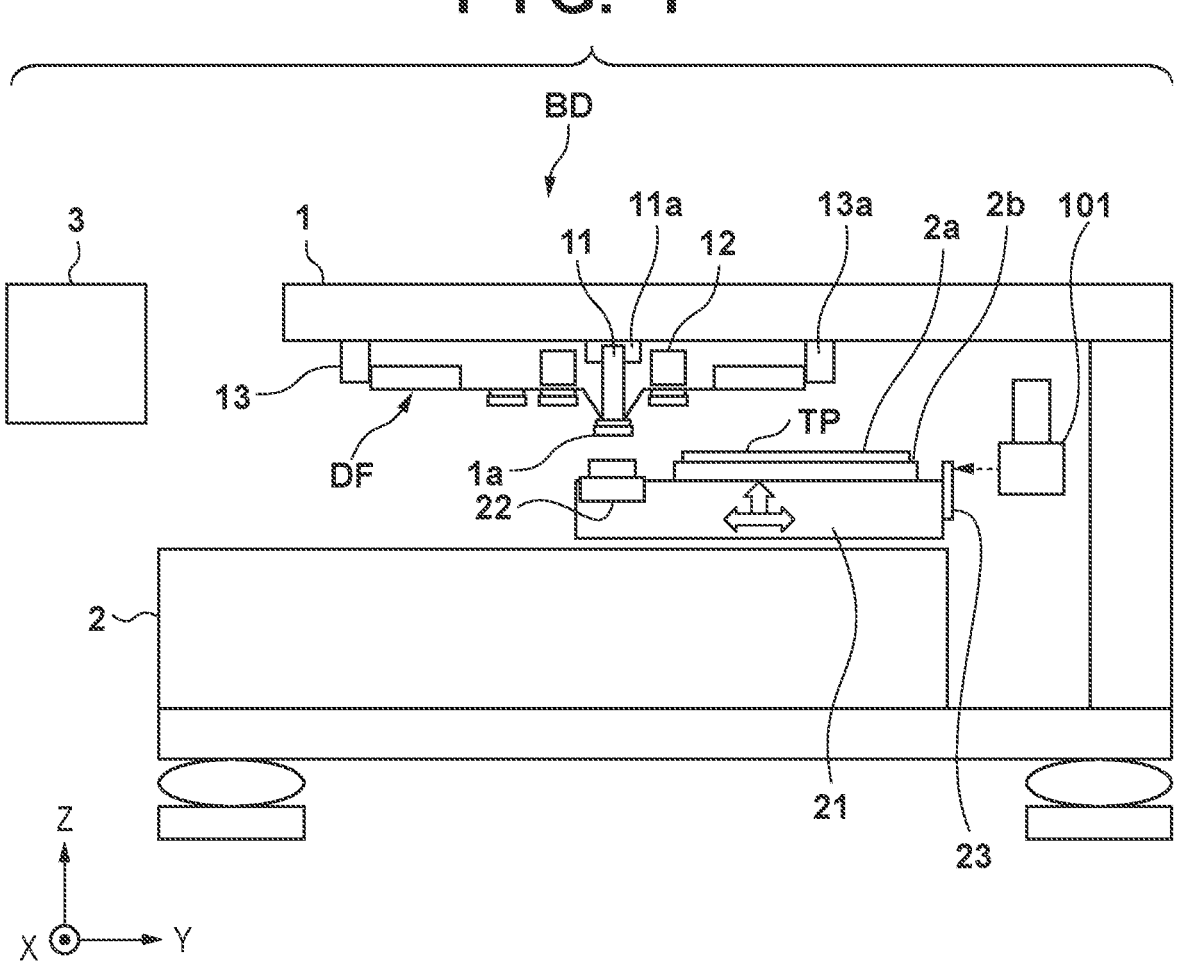
F I G. 2
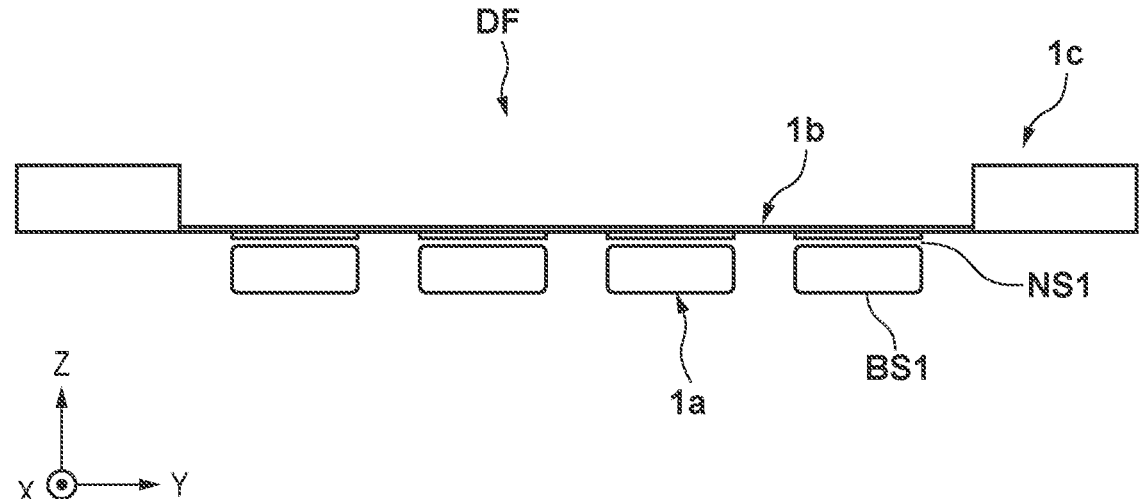

BONDING APPARATUS, BONDING METHOD AND ARTICLE MANUFACTURING METHOD

BACKGROUND OF THE INVENTION

Field of the Invention

The present invention relates to a bonding apparatus, a bonding method and an article manufacturing method.

Description of the Related Art

Conventionally, there has been proposed a technique of performing surface treatment on a die with a semiconductor element manufactured thereon, and directly bonding the die to a bonded object. Japanese Patent Laid-Open No. 2016-92078 discloses a technique of bonding the surface of a semiconductor chip (second object) to the surface of a substrate (first object).

In recent years, a technique has been proposed in which different dies called Chiplets are bonded with high density, thereby implementing a high-performance semiconductor device in a single package. In such a technique, the interval between high-density I/O bonding pads arranged on the respective dies decreases. Hence, a bonding apparatus is demanded to improve the bonding position accuracy.

In the technique disclosed in Japanese Patent Laid-Open No. 2016-92078, the die and the substrate are held such that the activated surface of the die adhered to a sheet and the activated surface of the substrate face each other, and the back surface of the die is pressed, so that the die and the substrate are tightly bonded. Thus, in this technique, the back surface of the die is pressed after relative positioning (alignment) between the die and the surface is performed. Therefore, a positional shift occurs upon pressing, and it is difficult to bond the die and the substrate while keeping the high positioning accuracy (bonding position accuracy).

SUMMARY OF THE INVENTION

The present invention provides a technique advantageous in implementing highly accurate positioning upon bonding a second object to a first object.

According to one aspect of the present invention, there is provided a bonding apparatus for bonding a second object to a first object, including a holding unit configured to hold a sheet with the second object stuck thereto, a protrusion mechanism configured to protrude the second object to a side of the first object via the sheet held by the holding unit, a measurement unit configured to measure, with respect to the first object, a position of the second object stuck to the sheet held by the holding unit, and a processing unit configured to perform a process of positioning the first object and the second object based on the position measured by the measurement unit in a state in which the second object is protruded to the side of the first object by the protrusion mechanism.

Further aspects of the present invention will become apparent from the following description of exemplary embodiments with reference to the attached drawings.

BRIEF DESCRIPTION OF THE DRAWINGS

FIG. 1 is a schematic view showing the arrangement of a bonding apparatus as one aspect of the present invention.

FIG. 2 is a sectional view showing the arrangement of a dicing frame.

DESCRIPTION OF THE EMBODIMENTS

Figure 3A:
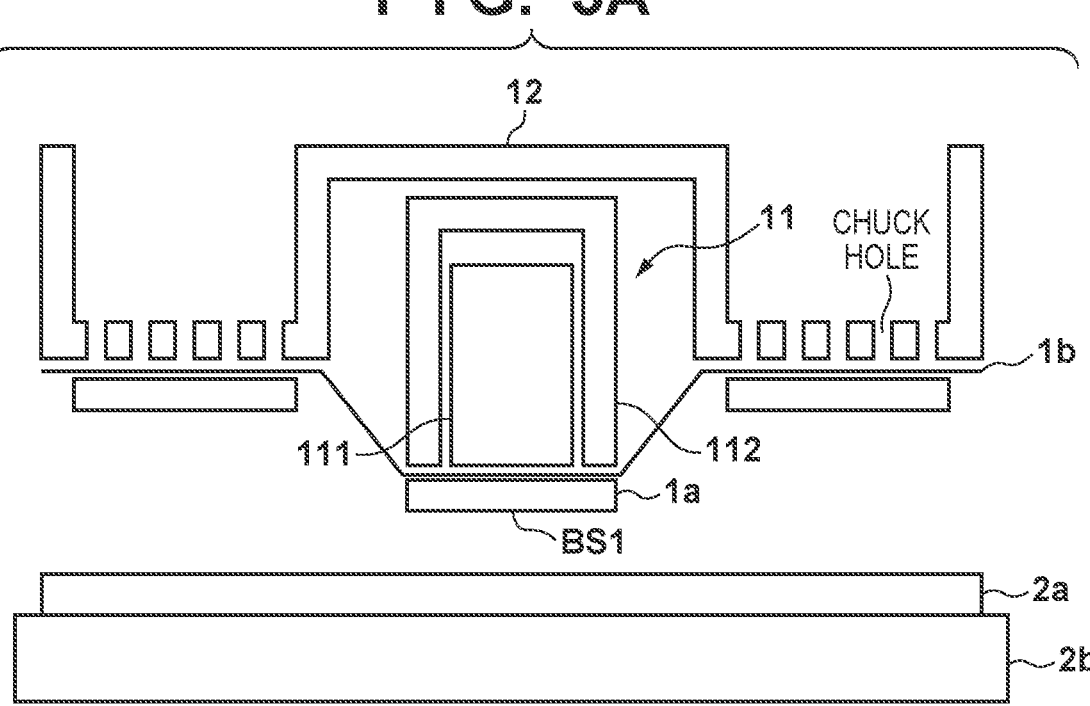
FIGS. 3A and 3B are views showing a specific operation image of a protrusion mechanism and a chucking mechanism in a bonding operation.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A bonding apparatus as one aspect of the present invention is mainly applied to a step of bonding the second object (second bonded object) to the first object (first bonded object) or a plurality of portions of the first object (bonding process). Note that in the following description, a substrate (wafer) with a semiconductor device manufactured thereon is defined as the first object, and a separated die with a semiconductor device manufactured thereon is defined as the second object, but the present invention is not limited to this.

The first object includes, in addition to a substrate with a semiconductor device manufactured thereon, for example, a silicon substrate, a silicon substrate formed with wirings, a glass substrate, a glass panel formed with wirings, and an organic panel (PCB) formed with wirings. The first object also includes, for example, a metal panel, and a substrate with a semiconductor device manufactured thereon, to which some dies with semiconductor devices manufactured thereon have already been bonded.

The second object includes, in addition to the separated die, for example, a stack of some already separated dies, a small piece of a material, an optical element, a MEMS, and a structure.

The bonding method of the first object and the second object is also not limited. The bonding method of the first object and the second object includes, for example, bonding using an adhesive agent, bonding using a temporary adhesive agent, bonding by hybrid bonding, atomic diffusion bonding, vacuum bonding, bump bonding, and the like. In this manner, the bonding method of the first object and the second object includes various temporary bonding methods and permanent bonding methods.

Industrial application examples of the bonding apparatus as one aspect of the present invention are, for example, application examples described below.

The first application example is manufacturing of a stacked memory. When the bonding apparatus as one aspect of the present invention is applied to manufacturing of a stacked memory, the first object is a substrate (wafer) with a memory as a semiconductor device manufactured thereon, and the second object is a memory as a separated die. In general, about eight layers are stacked. Hence, in bonding of the eighth layer, the first object is the substrate to which six layers of memories have already been bonded. The final layer may be a driver for driving the memories.

The second application example is heterogeneous integration of a processor. The mainstream of a conventional processor is an SoC obtained by forming a logic circuit and an SRAM in one semiconductor element. To the contrary, in heterogeneous integration, respective elements are manufactured on separate substrates while applying a process optimal for each element, and bonded to manufacture a processor. This can implement cost reduction and yield improvement of the processor. When the bonding apparatus as one aspect of the present invention is applied to heterogeneous integration, the first object is a substrate (wafer) with a logic device as a semiconductor device manufactured thereon. The second object is a die such as an SRAM, an antenna, or a driver separated after probing. Normally, different dies are sequentially bonded. Hence, the bonded objects on the first object sequentially increase. For example, in a case of starting bonding from an SRAM, when bonding the element next to the SRAM, the logic substrate (wafer) with the SRAM bonded thereto serves as the first object. Note that when bonding a plurality of dies, as for the order of bonding, bonding is preferably stated from a thin die such that a bonding head does not interfere with a bonded die.

The third application example is 2.5D bonding using a silicon interposer. The silicon interposer is a silicon substrate (wafer) with wirings formed thereon. The 2.5D bonding is a method of bonding separated dies using the silicon interposer, thereby electrically bonding the dies. When the bonding apparatus as one aspect of the present invention is applied to die bonding to the silicon interposer, the first object is a silicon substrate (wafer) formed with wirings, and the second object is a separated die. In general, a plurality of types of dies are bonded to the silicon interposer. Hence, the first object also includes a silicon interposer with several dies bonded thereto. When bonding a plurality of dies, as for the order of bonding, bonding is preferably started from a thin die such that a bonding head does not interfere with a bonded die.

The fourth application example is 2.1D bonding using an organic interposer or a glass interposer. The organic interposer is an organic panel (PCB substrate or CCL substrate) used as a package substrate, on which wirings are formed. The glass interposer is a glass panel with wirings formed thereon. The 2.1D bonding is a method of bonding separated dies to the organic interposer or the glass interposer, thereby electrically bonding the dies by the wirings on the interposer. When the bonding apparatus as one aspect of the present invention is applied to die bonding to the organic interposer, the first object is an organic panel formed with wirings, and the second object is a separated die. When the bonding apparatus as one aspect of the present invention is applied to die bonding to the glass interposer, the first object is a glass panel formed with wirings, and the second object is a separated die. In general, a plurality of types of dies are bonded to the organic interposer or the glass interposer. Hence, the first object also includes an organic interposer or a glass interposer with several dies bonded thereto. When bonding a plurality of dies, as for the order of bonding, bonding is preferably started from a thin die such that a bonding head does not interfere with a bonded die.

The fifth application example is temporary bonding in a fan-out package manufacturing process. There is known fan-out wafer-level packaging that reconstructs separated dies into a wafer shape using a mold resin to do packaging. There is also known fan-out panel-level packaging that reconstructs separated dies into a panel shape using a mold resin to do packaging. Such packaging is applied to semiconductor manufacturing as advanced packaging. In the packaging, rewirings from the dies to bumps are formed, or rewirings that bond different types of dies are formed on a molded reconstructed substrate. At this time, if the die array accuracy is low, when transferring the rewiring pattern using a step-and-repeat exposure apparatus, the rewiring pattern cannot accurately be positioned (aligned) with respect to the dies. For this reason, the dies are required to be arrayed with high accuracy. When the bonding apparatus as one aspect of the present invention is applied to the fan-out package manufacturing process, the first object is a metal panel, and the second object is a separated die. The separated dies are temporarily bonded to the substrate such as a metal panel by a temporary adhesive agent. After that, the separated dies are molded into a wafer shape or a panel shape by a molding apparatus, and separated from the metal panel after molding. Thus, a reconstructed wafer or a reconstructed panel is manufactured. In the application to this bonding, the bonding position by the bonding apparatus is preferably adjusted to correct an array deformation caused by the molding process.

The sixth application example is heterogeneous substrate bonding. For example, in the field of infrared image sensors, InGaAs is known as a high sensitivity material. Accordingly, if InGaAs is used for a sensor unit that receives light, and silicon capable of implementing high-speed processing is used for a logic circuit that extracts data, a high-sensitivity high-speed infrared image sensor can be manufactured. However, from InGaAs crystal, only substrates (wafers) whose diameter is as small as 4 inches are mass-produced, which is smaller than a mainstream silicon substrate having a size of 300 mm. Hence, a technique of bonding a separated InGaAs substrate to a 300-mm silicon substrate with a logic circuit formed thereon has been proposed. The bonding apparatus as one aspect of the present invention can also be applied to heterogeneous substrate bonding for bonding substrates made of different materials and having different sizes. When the bonding apparatus as one aspect of the present invention is applied to heterogeneous substrate bonding, the first object is a substrate such as a silicon substrate (wafer) with a large diameter, and the second object is a small piece of a material such as InGaAs. The small piece of the material is a slice of a crystal. The piece is preferably cut into a rectangular shape.

First Embodiment

FIG. 1 is a schematic view showing the arrangement of a bonding apparatus BD as one aspect of the present invention. In this embodiment, as shown in FIG. 1, directions are indicated on an XYZ coordinate system. Typically, an X-Y plane is a plane parallel to the horizontal plane, and a Z-axis is an axis parallel to the vertical direction. X-, Y-, and Z-axes are shown as directions that are orthogonal to each other or cross each other. This also applies to the other drawings.

In this embodiment, the bonding apparatus BD is embodied as an apparatus for bonding a second object $1a$ such as a die to a first object $2a$ such as a substrate. As shown in FIG. 1, the bonding apparatus BD includes a first module $\mathbf{1}$, a second module $\mathbf{2}$, and a control unit $\mathbf{3}$.

The first module $\mathbf{1}$ is a module for mounting a dicing frame DF. The first module $\mathbf{1}$ includes a holding unit $\mathbf{13}$ that holds the dicing frame DF loaded into the bonding apparatus BD. FIG. 2 is a sectional view showing the arrangement of the dicing frame DF. The dicing frame DF includes a frame $1c$, and a sheet $1b$ attached to the frame $1c$. A plurality of the second objects $1a$ are stuck (adhered) to the sheet $1b$. Each second object 1a is stuck to the sheet 1b via a non-bonding surface NS1 opposite to a bonding surface BS1 (the surface to be bonded to the first object 2a). The holding unit 13 holds the dicing frame DF (sheet 1b) via the frame 1c in a state in which a bonding target portion TP of the first object 2a and the bonding surface BS1 of the second object 1a face each other. The holding unit 13 includes a driving unit 13a that two-dimensionally drives the sheet 1b with respect to a protrusion mechanism 11 in the X-Y plane (horizontal plane) orthogonal to the Z direction (vertical direction) in which the protrusion mechanism 11 protrudes the second object 1a stuck to the sheet 1b. With this arrangement, it is possible to repeat the bonding operation while changing the position of the sheet 1b (the second object 1a stuck to the sheet 1b) with respect to the protrusion mechanism 11.

The first module 1 includes the protrusion mechanism 11. The protrusion mechanism 11 is a mechanism that protrudes the second object 1a stuck to the sheet 1b to the first object 2a side via the sheet 1b of the dicing frame DF held by the holding unit 13, more specifically, by pushing the back surface of the sheet 1b opposite to the sticking surface. The protrusion mechanism 11 also functions as a separation mechanism that separates the second object 1a from the sheet 1b in a state in which the first object 2a and the second object 1a are bonded. The protrusion mechanism 11 may be provided with a driving unit 11a that drives the protrusion mechanism 11 with respect to the sheet 1b of the dicing frame DF held by the holding unit 13 in the X-Y plane orthogonal to the Z direction in which the second object 1a stuck to the sheet 1b is protruded. However, the driving unit 11a is not an essential component, and may be provided if no driving unit 13a is provided in the holding unit 13. In other words, either one of the driving units 11a and 13a may be provided so as to be capable of changing the relative position between the protrusion mechanism 11 and the sheet 1b in the X-Y plane.

The first module 1 includes a chucking mechanism 12. The chucking mechanism 12 functions as a holding mechanism that holds, by chucking via the sheet 1b, non-target objects excluding a target object to be protruded to the first object 2a side by the protrusion mechanism 11 among the plurality of second objects 1a stuck to the sheet 1b. Here, the target object is the second object 1a protruded to the first object 2a side in one bonding operation, and the number thereof is not limited (one or a plurality of second objects 1a may be protruded). The non-target object is the second object 1a not to be protruded to the first object 2a side in one bonding operation. More specifically, the non-target object is the second object 1a stuck to the vicinity of the target object.

The chucking mechanism 12 is basically configured to be drivable interlockingly (in synchronization) with the protrusion mechanism 11 so as to maintain the positional relationship with the protrusion mechanism 11. For example, the chucking mechanism 12 may be configured to be drivable via the driving unit 11a, which drives the protrusion mechanism 11, by attaching (connecting) the chucking mechanism 12 to the protrusion mechanism 11. Alternatively, the chucking mechanism 12 may be configured to be drivable by independently providing a driving unit that drives the chucking mechanism 12.

In this embodiment, the chucking mechanism 12 includes a plurality of chuck holes for chucking and holding via the sheet 1b. Here, if the chuck hole of the chucking mechanism 12 is too large, the second object 1a may be chucked together with the sheet 1b, and a crack may be generated. Therefore, it is necessary to appropriately set the size, number, and arrangement of the chuck holes of the chucking mechanism 12 in accordance with the size and thickness of the second object 1a and the hardness and thickness of the sheet 1b.

The second module 2 is a module for mounting the first object 2a. The second module 2 includes a stage 21 that holds the first object 2a via a chuck 2b that chucks the first object 2a, and a stage driving unit that can drive the stage 21 with respect to six axes including the X-, Y-, and Z-axes and the tilt directions of the respective axes.

A target 23, which serves as a measurement target upon measuring the position of the stage 21 (the first object 2a held by the stage 21) by a position measurement device 101, is provided (fixed) on the stage 21. The position measurement device 101 detects the target 23 provided on the stage 21, thereby measuring the position of the stage 21, that is, the position of the first object 2a held by the stage 21. An example of the position measurement device 101 is an interferometer, and in this case, the target 23 is a bar mirror. Another example of the position measurement device 101 is an encoder head, and in this case, the target 23 is an encoder scale.

The second module 2 includes a measurement unit 22 provided in the stage 21 so as to face the dicing frame DF. The measurement unit 22 measures the position of the second object 1a stuck to the sheet 1b of the dicing frame DF held by the holding unit 13, more specifically, the position of the second object 1a (target object), which serves as the target to be protruded to the first object 2a side by the protrusion mechanism 11, with respect to the first object 2a. In this embodiment, the measurement unit 22 measures the position of the second object 1a in a state in which the second object 1a is protruded to the first object 2a side by the protrusion mechanism 11 and the first object 2a and the second object 1a are spaced apart from each other. The measurement unit 22 includes, for example, a camera, and detects the feature point of the second object 1a serving as the target object, or the outer shape of the second object 1a, thereby measuring the position (the position in the X-Y plane or the tilt with respect to the X-Y plane) of the second object 1a with respect to the first object 2a.

The control unit 3 is formed from, for example, a computer (information processing apparatus) including a CPU, a memory, and the like. The control unit 3 operates the bonding apparatus BD by comprehensively controlling the respective units of the bonding apparatus BD in accordance with a program stored in a memory unit, thereby performing a bonding operation of bonding the second object 1a to the first object 2a. In the bonding operation, the control unit 3 also functions as a processing unit that performs a process of positioning the second object 1a and the first object 2a based on the position of the second object 1a measured by the measurement unit 22 in the state in which the second object 1a is protruded to the first object 2a side by the protrusion mechanism 11.

Figure 3B:
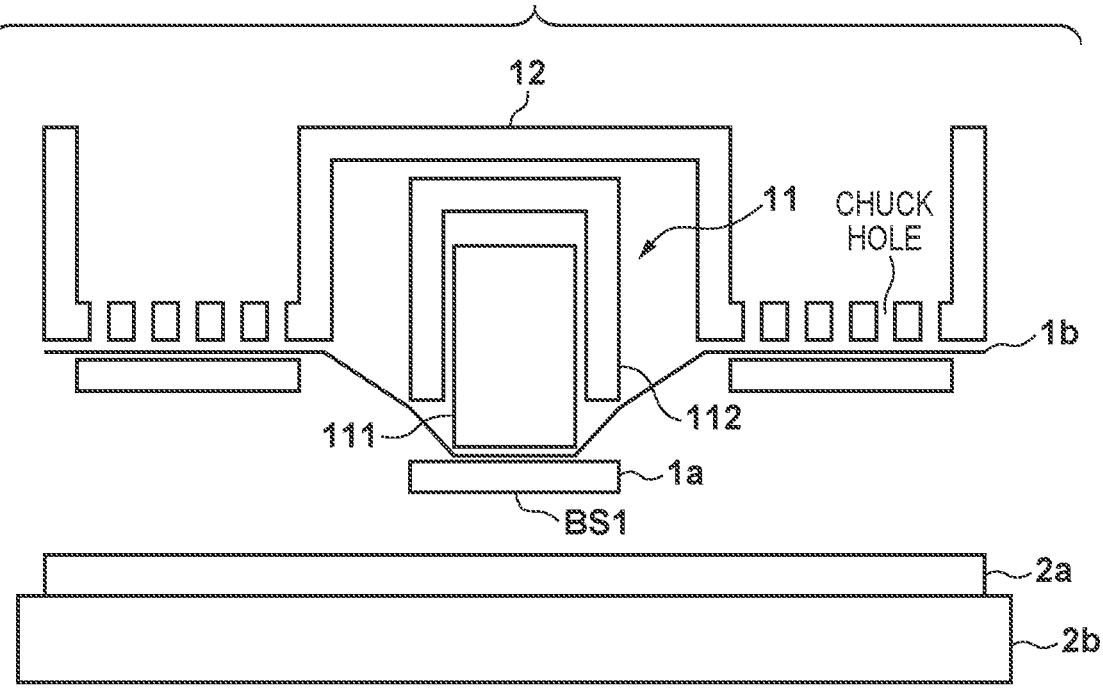

FIGS. 3A and 3B are views showing a specific operation image of the protrusion mechanism 11 and the chucking mechanism 12 in the bonding operation of bonding the second object 1a to the first object 2a. The protrusion mechanism 11 includes a protrusion unit 112 (push-down stage) for protruding the second object 1a to the first object 2a side, and a separation unit 111 for separating the second object 1a bonded to the first object 2a from the sheet 1b.

As shown in FIGS. 3A and 3B, in this embodiment, the separation unit 111 is formed as an internal mechanism incorporated in the protrusion unit 112. The protrusion unit 112 pushes the outer peripheral region of the second object 1a to the first object 2a side via the sheet 1b held by the holding unit 13. The separation unit 111 pushes the inner region of the second object 1a, which is inside the outer peripheral region, to the first object 2a side via the sheet 1b. Considering a damage to the second object 1a, for example, a resin or rubber is preferable as the material of each of the protrusion unit 112 and the separation unit 111. Considering heat transfer to the second object 1a, invar is preferable as the material. Considering sufficient push of the second object 1a and a damage to the second object 1a, for example, a block shape is preferable as the shape of each of the protrusion unit 112 and the separation unit 111.

In the bonding operation, first, as shown in FIG. 3A, among the plurality of second objects 1a stuck to the sheet 1b, the outer peripheral region of the second object 1a to be bonded to the first object 2a, that is, the target object is pushed to the first object 2a side by the protrusion unit 112. At this time, among the plurality of second objects 1a stuck to the sheet 1b, the second objects 1a not to be bonded to the first object 2a, that is, the non-target objects are chucked by the chucking mechanism 12. With this, only the target object, which is the second object 1a to be bonded to the first object 2a, can be brought into contact with the first object 2a (protruded to the first object 2a side).

Then, the measurement unit 22 measures the position of the second object 1a, which is the target object protruded to the first object 2a side by the protrusion unit 112, with respect to the first object 2a. Based on the position of the second object 1a measured by the measurement unit 22, the second object 1a and the first object 2a are positioned (a positioning process is performed). More specifically, the stage 21 holding the first object 2a is driven with respect to the second object 1a such that the positional shift between the bonding target portion TP of the first object 2a and the bonding surface BS1 of the second object 1a is reduced and the bonding target portion TP matches the bonding surface B Si.

When the second object 1a and the first object 2a are positioned based on the position of the second object 1a measured by the measurement unit 22, and the first object 2a and the second object 1a come into contact with each other, a bonding force is generated therebetween, and the second object 1a is bonded to the first object 2a. At this time, in a state in which the first object 2a and the second object 1a are in contact with each other, the inner region of the second object 1a is further pushed to the first object 2a side by the separation unit 111 as shown in FIG. 3B. More specifically, in the state in which the second object 1a and the first object 2a are bonded, the separation unit 111 changes the shape of the inner region pushed to the first object 2a side, thereby separating the second object 1a from the sheet 1b. Alternatively, the separation unit 111 may separate the second object 1a from the sheet 1b by selectively pushing, to the first object 2a side, a plurality of regions in the inner region pushed to the first object 2a side in the state in which the second object 1a and the first object 2a are bonded. For example, by sequentially pushing the plurality of regions in the inner region of the second object 1a from the outside, the second object 1a can be separated from the outer peripheral region. In this manner, the second object 1a bonded to the first object 2a is separated from the sheet 1b of the dicing frame DF.

Note that, to facilitate understanding of the operation of the separation unit 111, FIG. 3B shows the state in which the second object 1a and the first object 2a are not bonded (in contact with each other). However, in practice, the separation unit 111 is operated in the state in which the second object 1a and the first object 2a are bonded. In addition, in FIGS. 3A and 3B, one protrusion mechanism 11 protrudes one second object 1a (they one-to-one correspond to each other), but the present invention is not limited to this. For example, the protrusion mechanism 11 can be configured such that one protrusion mechanism 11 simultaneously protrudes two or more second objects 1a.

Figure 4:
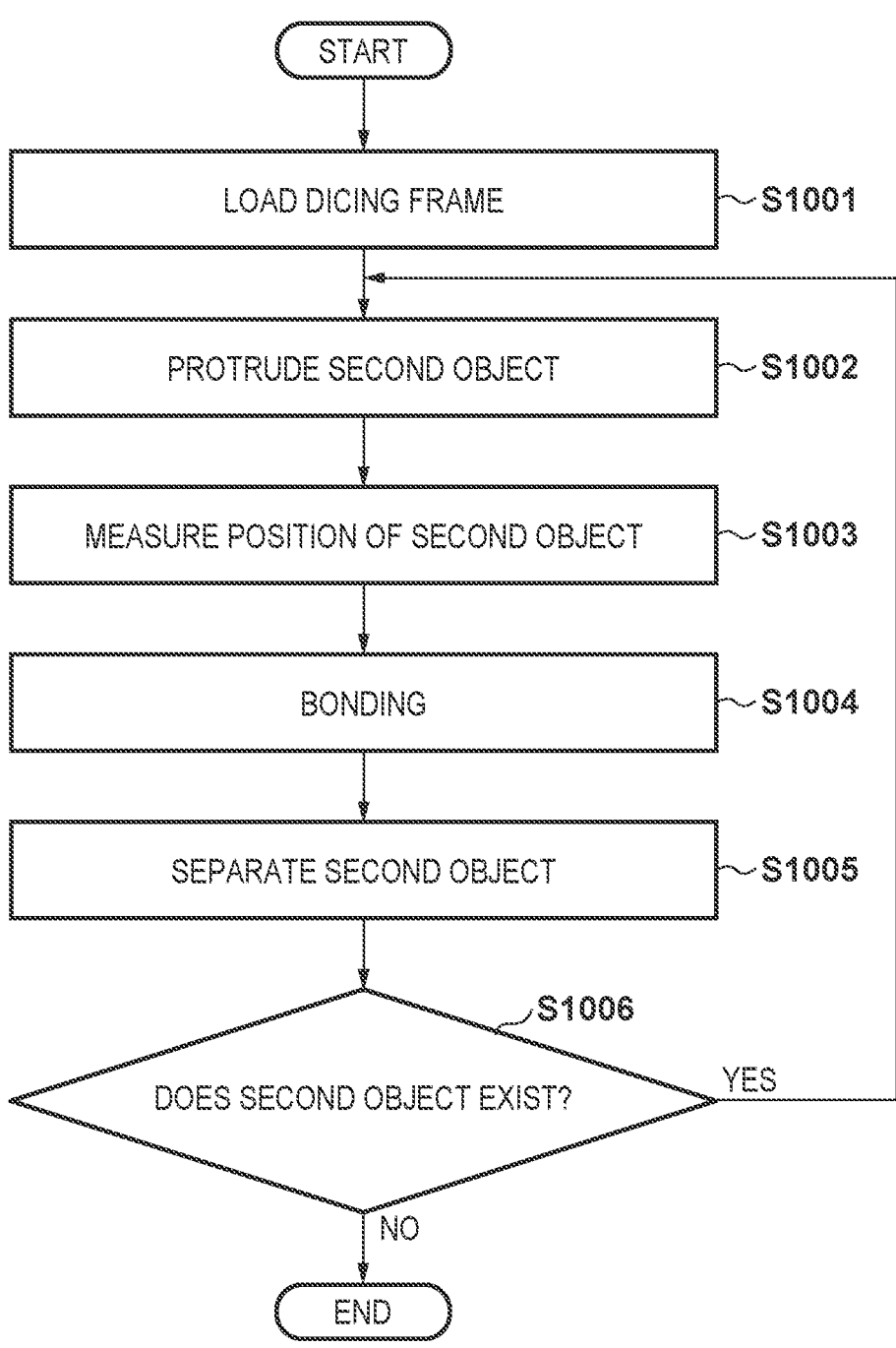
FIG. 4 is a flowchart for explaining the bonding operation.

With reference FIG. 4, the bonding operation of bonding the second object 1a to the first object 2a will be described. As has been described above, the bonding operation is performed by the control unit 3 comprehensively controlling the respective units of the bonding apparatus BD.

In step S1001, the dicing frame DF in which the plurality of second objects 1a are stuck to the sheet 1b is loaded into the bonding apparatus BD. The dicing frame DF is held by the holding unit 13 in the state in which the bonding target portion TP of the first object 2a and the bonding surface BS1 of the second object 1a face each other.

Once the holding unit 13 holds the dicing frame DF, the dicing frame DF (more specifically, the sheet 1b to which the second objects 1a are stuck) is preferably expanded. If the dicing frame DF is not expanded, the protrusion amount may be insufficient upon protruding the second object 1a to the first object 2a side by the protrusion mechanism 11. In addition, the second object 1a (non-target object) in the vicinity of the second object 1a to be protruded to the first object 2a side may be damaged. In many cases, the dicing frame DF is basically loaded in an unexpanded state. However, in a case in which the dicing frame DF expanded in advance is loaded, the dicing frame DF need not be expanded in the bonding apparatus BD.

As the dicing frame expanded in advance, for example, there is a dicing frame called a grip ring or double ring. This dicing frame sandwiches and stretches the sheet by two rings of an inner ring and an outer ring, thereby obtaining an effect as in expansion. For a small pin IC such as a discrete semiconductor, a grip ring is often used.

On the other hand, in a case in which the dicing frame not expanded in advance is loaded, it is preferable to finely adjust the expansion amount. The expansion amount is required to be changed severely in accordance with the type of the sheet and the type of the chip (second object). For example, for a thin chip, if the expansion amount is large, the chip excessively peels off and the outer periphery of the chip warps. In this case, for example, the measurement unit 22 such as a camera cannot recognize the outer shape of the chip, so that it may become difficult to measure the position of the chip. For a small chip, if the expansion amount is large, the chip excessively peels off, and the chip may be separated (come off) from the sheet. On the other hand, for a large or thick chip, if the expansion amount is small, the peel-off amount of the chip from the sheet decreases, and this may lead to a separation failure upon separating the chip from the sheet by the protrusion mechanism 11. Therefore, in the case in which the dicing frame not expanded in advance is loaded, the expansion amount is preferably adjusted while understanding the characteristics of the sheet and the chip (second object).

Figure 5A:
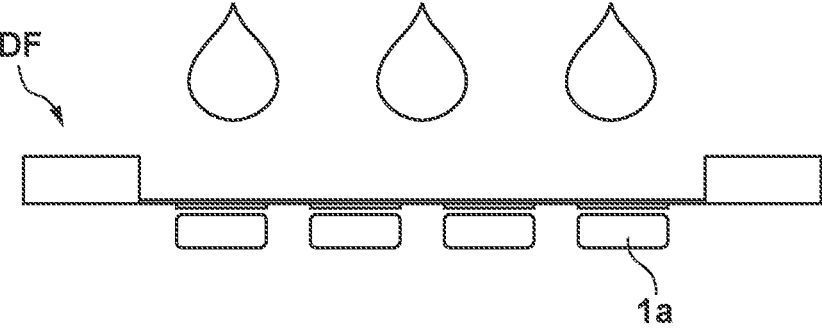
FIGS. 5A to 5C are views for explaining preprocesses for bonding the first object and the second object.
Figure 5B:
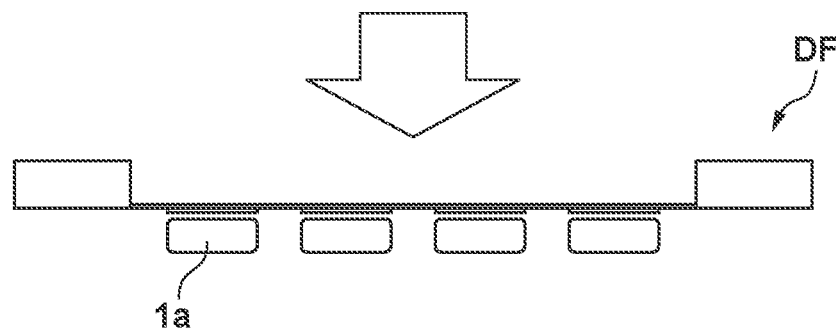
Figure 5C:
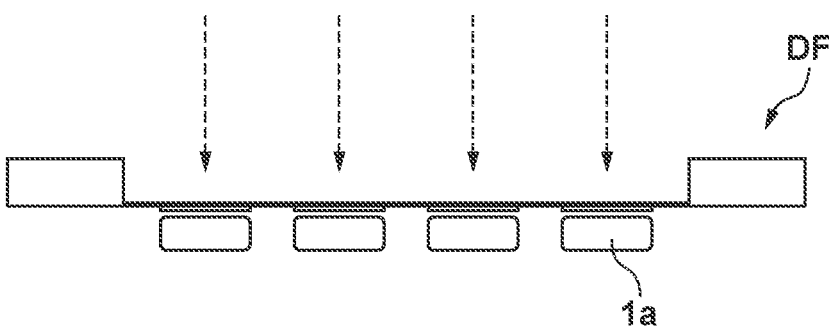

If a foreign substance adheres to the bonding target portion TP of the first object 2a or the bonding surface BS1 of the second object 1a, they are bonded insufficiently. To prevent this, the interior (space) of the bonding apparatus BD is kept at a high cleanliness of about class 1. Also for the dicing frame DF, in order to suppress adhesion of foreign substances, the dicing frame DF is accommodated in a dedicated conveyance case that has a high airtightness and keeps a high cleanliness. Further, after the dicing frame DF is loaded into the bonding apparatus BD, as shown in FIG. 5A, the dicing frame DF may be washed in the bonding apparatus BD to increase the cleanliness. In the bonding apparatus BD, in addition to washing the dicing frame DF, various preprocesses are performed for bonding the bonding target portion TP of the first object 2a and the bonding surface BS1 of the second object 1a. For example, when bonding the first object 2a and the second object 1a using an adhesive agent, as shown in FIG. 5B, the adhesive agent is applied to the dicing frame DF. When bonding the first object 2a and the second object 1a using hybrid bonding, as shown in FIG. 5C, a process of activating the surface of the dicing frame DF by applying heat or light is performed. Note that since the bonding apparatus BD needs to perform positioning (alignment) in the absence of disturbances, these preprocesses may be performed in a separate apparatus outside the bonding apparatus BD. FIGS. 5A to 5C are views for explaining the preprocesses for bonding the first object 2a and the second object 1a.

The preprocesses for bonding the first object 2a and the second object 1a are preferably performed before expanding the dicing frame DF. For example, if the dicing frame DF is washed after the dicing frame DF is expanded, the second object 1a may be separated from the sheet 1b by the washing. In order to decrease the adhesive force of the adhesive agent adhering the sheet 1b and the second object 1a, the dicing frame DF may be irradiated with UV in advance. In this case, if the dicing frame DF is washed after the UV irradiation, the second object 1a may be separated from the sheet 1b by the washing. Therefore, the process such as UV irradiation for decreasing the adhesive force of the adhesive agent is preferably performed after the dicing frame DF is washed.

Referring back to FIG. 4, in step S1002, the protrusion mechanism 11 protrudes, among the plurality of second objects 1a stuck to the sheet 1b of the dicing frame DF held by the holding unit 13, the second object 1a to be bonded to the first object 2a, that is, the target object. Note that before protruding the second object 1a by the protrusion mechanism 11, the sheet 1b (second object 1a) is positioned with respect to the protrusion mechanism 11 such that the target object is located below the protrusion mechanism 11. To position the sheet 1b with respect to the protrusion mechanism 11, the driving unit 13a that drives the sheet 1b with respect to the protrusion mechanism 11, or the driving unit 11a that drive the protrusion mechanism 11 with respect to the sheet 1b is used.

Here, along with positioning the sheet 1b with respect to the protrusion mechanism 11, the protrusion mechanism 11 is preferably made parallel to the target object among the second objects 1a stuck to the sheet 1b (the parallelism is made to fall within an allowable range). More specifically, the target object, which is the second object 1a to be bonded to the first object 2a, is observed by, for example, the measurement unit 22 including a camera, and the tilt of the protrusion mechanism 11 or the holding unit 13 is adjusted based on the observation result. Thus, the parallelism between the protrusion mechanism 11 and the target object is made to fall within the allowable range. Note that, depending on the bonding accuracy and bonding budget between the first object 2a and the second object 1a, the parallelism between the protrusion mechanism 11 and the target object may fall within the allowable range only by adjustment in the assembly stage of the bonding apparatus BD.

After the target object, which is the second object 1a to be bonded to the first object 2a, is located below the protrusion mechanism 11, the protrusion mechanism 11 protrudes the target object. At this time, the chucking mechanism 12 is simultaneously operated. More specifically, the chucking mechanism 12 chucks and holds the second object 1a not to be bonded to the first object 2a, that is, the non-target object, in the vicinity of the target object. With this, a clearance is formed between the target object, which is the second object 1a to be bonded to the first object 2a, and the non-target object not to be bonded to the first object 2a, and this facilitates protrusion of the target object alone by the protrusion mechanism 11. In this manner, in this embodiment, by simultaneously operating the protrusion mechanism 11 and the chucking mechanism 12, the target object, which is the second object 1a to be bonded to the first object 2a, is protruded.

As has been described above, the protrusion mechanism 11 has the function of protruding the second object 1a (mainly, the protrusion unit 112), and the function of separating the second object 1a from the sheet 1b (mainly, the separation unit 111). Note that in this embodiment, of the functions of the protrusion mechanism 11, only the function of protruding the second object 1a is operated in step S1002.

In step S1003, in the state in which the target object, which is the second object 1a to be bonded to the first object 2a, is protruded, the measurement unit 22 measures the position of the target object (second object 1a) with respect to the first object 2a (bonding target portion TP thereof). As has been described above, the measurement unit 22 is provided in the stage 21 holding the first object 2a. Accordingly, the position of the target object can be measured by driving the stage 21 so as to locate the measurement unit 22 below the target object which is the second object 1a to be bonded to the first object 2a.

In this embodiment, in step S1003, the position of the target object is measured from the contrast difference between the target object (outer periphery thereof) and the vicinity of the target object (the protrusion unit 112 and the separation unit 111) obtained by detecting the outer shape of the target object which is the second object 1a to be bonded to the first object 2a. Therefore, surface treatment for increasing the contrast difference is preferably performed on the surface (the surface for pushing the second object 1a via the sheet 1b) of each of the protrusion unit 112 and the separation unit 111 on the first object 2a side, in particular, on the region of the surface outside the target object.

Examples of the surface treatment for increasing the contrast difference between the second object 1a (target object) and the vicinity of the second object 1a are black chromium treatment, mat black alumite treatment, Raydent® treatment, and the like. By blackening the surface of each of the protrusion unit 112 and the separation unit 111 on the first object 2a side by the surface treatment as described above, the measurement unit 22 can easily detect the outer shape of the second object 1a. Note that even if the surface of each of the protrusion unit 112 and the separation unit 111 on the first object 2a side is blackened, if the surface is glossy, the surface reflects light, and this hinders detection of the outer shape of the second object 1a. Therefore, it is particularly preferable to perform surface treatment for suppressing light reflection such as delustering on the surface of each of the protrusion unit 112 and the separation unit 111 on the first object 2a side.

In step S1004, the target object, which is the second object 1a to be bonded to the first object 2a, is bonded to the bonding target portion TP of the first object 2a. More specifically, the first object 2a and the target object, which is the second object 1a to be bonded to the first object 2a, are positioned based on the position of the second object 1a measured in step S1003. Positioning of the first object 2a and the target object is implemented by, for example, driving the stage 21 holding the first object 2a such that the positional shift between the bonding target portion of the first object 2a and the target object (the bonding surface BS1 of the second object 1a) is reduced. At this time, in order to control the position of the stage 21 with high accuracy, the stage 21 is preferably driven while measuring the position of the stage 21 by the position measurement device 101. After the first object 2a and the target object are positioned, the target object is bonded to the bonding target portion TP of the first object 2a. Bonding of the first object 2a and the second object 1a is implemented by driving the stage 21 upward (+Z direction).

In step S1005, the protrusion mechanism 11 separates the second object 1a bonded to the first object 2a, that is, the target object from the sheet 1b. Here, only the function of the protrusion mechanism 11 for separating the second object 1a from the sheet 1b is operated. For example, separation of the second object 1a from the sheet 1b can be implemented by forming a gap, which serves as the start point of separation, between the second object 1a and the sheet 1b by the separation unit 111, and driving the stage 21 downward (−Z direction).

In step S1006, it is determined whether the second object 1a (the second object 1a to be bonded to the first object 2a) exists (remains) in the dicing frame DF, that is, whether the second object 1a bonded to the first object 2a in step S1005 is the final target object. If the second object 1a exists in the dicing frame DF, the process returns to step S1002 to bond the second object 1a to the first object 2a. On the other hand, if no second object 1a exists in the dicing frame DF, the bonding operation is terminated. Note that even if no second object 1a exists in the dicing frame DF, the bonding operation can be continued by loading a new dicing frame DF into the bonding apparatus BD without stopping the bonding operation.

As has been described above, in this embodiment, before bonding the first object 2a and the second object 1a, the position of the second object 1a with respect to the first object 2a is measured in the state in which the second object 1a is protruded to the first object 2a side, and the first object 2a and the second object 1a are positioned based on the measurement result. Accordingly, positioning upon bonding the second object 1a to the first object 2a can be implemented with high accuracy. Further, the first object 2a and the second object 1a can be bonded while keeping the high positioning accuracy (bonding position accuracy).

Second Embodiment

Figure 6:
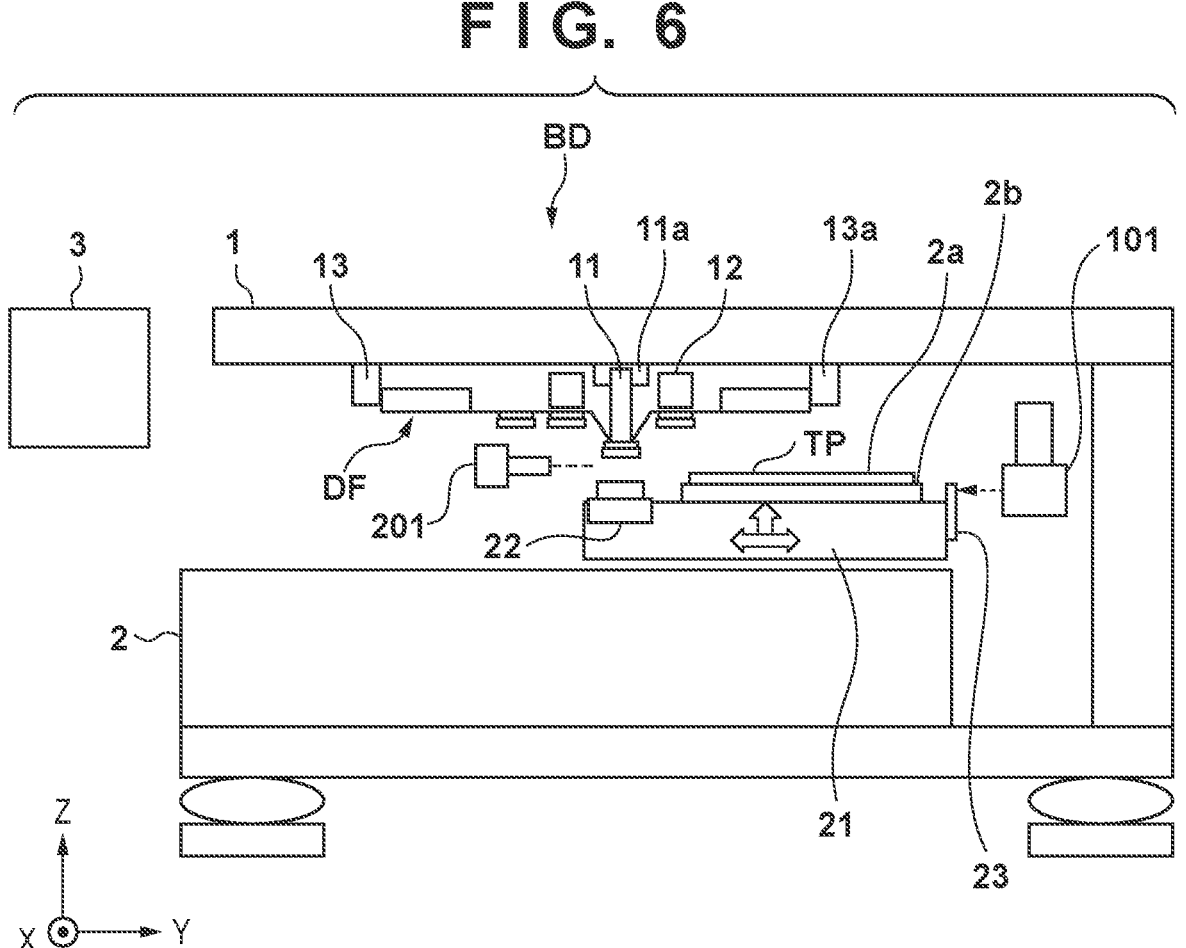
FIG. 6 is a schematic view showing another arrangement of a bonding apparatus as one aspect of the present invention.

FIG. 6 is a schematic view showing another arrangement of a bonding apparatus BD as one aspect of the present invention. In this embodiment, as shown in FIG. 6, the bonding apparatus BD further includes a separation mechanism 201 that separates a second object 1a bonded to a first object 2a from a sheet 1b. The separation mechanism 201 separates the second object 1a from the sheet 1b by applying light (for example, UV light) or heat to the sticking surface (adhering surface) between the second object 1a and the sheet 1b.

The separation mechanism 201 may be provided in place of a separation unit 111 forming a part of a protrusion mechanism 11, or may be provided in addition to the separation unit 111. Note that even if the separation mechanism 201 is provided in place of the separation unit 111, since the protrusion mechanism 11 includes a protrusion unit 112 for protruding the second object 1a to the first object 2a side, they are formed as a unit.

The separation mechanism 201 is arranged at a position where it can apply light or heat to the sticking surface between the second object 1a and the sheet 1b. For example, the separation mechanism 201 may be arranged on a holding unit 13 that holds a dicing frame DF, or may be arranged on a stage 21 that holds the first object 2a. Alternatively, the separation mechanism 201 may be configured to be drivable to a position where it can apply light or heat to the sticking surface between the second object 1a and the sheet 1b in the bonding operation of bonding the second object 1a to the first object 2a.

Third Embodiment

A method of manufacturing an article (a semiconductor IC element, a liquid crystal display element, a MEMS, or the like) using the above-described bonding apparatus BD will be described next. The article is manufactured by a step of preparing a first object, a step of preparing a second object, a step of manufacturing a bonded object by bonding the first object and the second object using the above-described bonding apparatus BD (bonding method (bonding operation), and a step of processing the bonded object in another known process. The other known process includes probing, dicing, bonding, packaging, and the like. According to the article manufacturing method, it is possible to manufacture an article of higher quality than before.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-168564 filed on Oct. 20, 2022, which is hereby incorporated by reference herein in its entirety.

What is claimed is:

1. A bonding apparatus for bonding a second object to a first object, comprising:

a holding unit configured to hold a sheet with the second object stuck thereto;

a protrusion mechanism including a protrusion unit and a separation unit, the protrusion unit being configured to move so as to protrude relative to the sheet in an area of the second object stuck thereby so as to move the second object to a side of the first object and come into contact with the first object, the separation unit being configured to separate the second object from the sheet in a state where the second object and the first object are bonded;

a measurement unit configured to measure, with respect to the first object, a position of the second object stuck to the sheet held by the holding unit in a state where the second object is moved to the side of the first object by the protrusion mechanism and the first object and the second object are spaced apart from each other; and a processing unit configured to perform a process of positioning the first object and the second object based on the position measured by the measurement unit in the state where the first object and the second object are spaced apart from each other, wherein the protrusion unit is configured to push an outer peripheral region of the second object to the side of the first object via the sheet, and wherein the separation unit is configured to separate the second object from the sheet by selectively pushing, to the side of the first object, a plurality of regions in an inner region of the second object, which is inside the outer peripheral region, in the state where the second object and the first object are bonded.

2. The apparatus according to claim 1, wherein the second object is stuck to the sheet via a surface opposite to a bonding surface of the second object with respect to a bonding target portion of the first object, and the holding unit is configured to hold the sheet in a state in which the bonding target portion of the first object and the bonding surface of the second object face each other.

3. The apparatus according to claim 2, wherein the processing unit is configured to perform the process such that a positional shift between the bonding target portion and the bonding surface is reduced.

4. The apparatus according to claim 1, wherein the separation unit is configured to separate the second object from the sheet by changing a shape of the inner region pushed to the side of the first object in the state in which the second object and the first object are bonded.

5. The apparatus according to claim 1, wherein the separation unit is configured to separate, from the sheet, the second object bonded to the first object by irradiating a sticking surface between the second object and the sheet with light.

6. The apparatus according to claim 1, wherein the separation unit is configured to separate, from the sheet, the second object bonded to the first object by applying heat to a sticking surface between the second object and the sheet.

7. The apparatus according to claim 1, wherein a plurality of second objects are stuck to the sheet, and the apparatus further comprises a holding mechanism configured to hold, among the plurality of second objects stuck to the sheet, a non-target object excluding a target object to be moved to the side of the first object by the protrusion mechanism.

8. The apparatus according to claim 4, wherein the holding mechanism is configured to hold the non-target object such that a clearance is formed between the target object and the non-target object.

9. The apparatus according to claim 1, further comprising a position measurement device configured to measure a position of the first object, wherein, in the process, the processing unit is configured to control the position of the first object with respect to the second object based on the position of the first object measured by the position measurement device.

10. The apparatus according to claim 1, wherein the holding unit includes a driving unit configured to drive the sheet with respect to the protrusion mechanism in a plane orthogonal to a direction in which the second object is moved by the protrusion mechanism.

11. The apparatus according to claim 1, further comprising a driving unit configured to drive the protrusion mechanism with respect to the sheet held by the holding unit in a plane orthogonal to a direction in which the second object is moved by the protrusion mechanism.

12. The apparatus according to claim 1, wherein a process for bonding is performed on the bonding surface of the second object in a state in which the second object is stuck to the sheet via a surface opposite to a bonding surface of the second object with respect to a bonding target portion of the first object.

13. The apparatus according to claim 12, wherein the process for bonding includes one of washing the bonding surface, applying an adhesive agent to the bonding surface, and activating the bonding surface.

* * * * *